(12) United States Patent
Kerekes (10) Patent No.: US 10,116,433 B2
(45) Date of Patent: Oct. 30, 2018

(54) CIRCUIT ARRANGEMENT AND METHOD FOR CLOCK AND DATA RECOVERY

(71) Applicant: ams AG, Unterpremstaetten (AT)

(72) Inventor: Tibor Kerekes, Budapest (HU)

(73) Assignee: ams AG, Unterpremstaetten (AT)

( * ) Notice: Subject to any disclaimer, the term of this patent is extended or adjusted under 35 U.S.C. 154(b) by 0 days.

(21) Appl. No.: 15/504,650

(22) PCT Filed: Jul. 30, 2015

(86) PCT No.: PCT/EP2015/067536
§ 371 (c)(1),
(2) Date: Feb. 16, 2017

(87) PCT Pub. No.: WO2016/026667
PCT Pub. Date: Feb. 25, 2016

(65) Prior Publication Data
US 2017/0237548 A1  Aug. 17, 2017

(30) Foreign Application Priority Data
Aug. 19, 2014 (EP) .................................. 14181449

(51) Int. Cl.
*H04L 7/10* (2006.01)
*H04L 7/033* (2006.01)
*H03L 7/10* (2006.01)
*H03L 7/08* (2006.01)

(52) U.S. Cl.
CPC ............ *H04L 7/033* (2013.01); *H03L 7/0807* (2013.01); *H03L 7/10* (2013.01); *H04L 7/10* (2013.01)

(58) Field of Classification Search
CPC ... H04L 7/033; H04L 7/10; H03L 7/10; H03L 7/0807
USPC ........................................................ 375/354
See application file for complete search history.

(56) References Cited

U.S. PATENT DOCUMENTS

| 4,365,210 A | 12/1982 | Harrington et al. |
| 7,826,581 B1 | 11/2010 | Prather et al. |
| 2009/0086872 A1 | 4/2009 | Liu et al. |
| 2013/0107913 A1 | 5/2013 | Savoj |

*Primary Examiner* — Michael Neff
(74) *Attorney, Agent, or Firm* — Fish & Richardson P.C.

(57) ABSTRACT

A circuit arrangement for clock and data recovery comprises a control unit, a phase-locked loop circuit and a sampling unit. The control unit is configured to derive a first reference signal and a second reference signal from an input signal. Furthermore, the control unit is configured to derive a common reference signal from one of the first reference signal and the second reference signal, selected depending on a mode of operation of the circuit arrangement. The phase-locked loop circuit is configured to generate an oscillator signal based on the common reference signal. The sampling unit is configured to extract a recovered data signal from the input signal.

20 Claims, 7 Drawing Sheets

CIRCUIT ARRANGEMENT AND METHOD FOR CLOCK AND DATA RECOVERY

BACKGROUND OF THE INVENTION

The present disclosure relates to a circuit arrangement for clock and data recovery, CDR, and to a method for CDR in communication systems.

In communication systems, in particular in packet based high-speed serial data communication systems, CDR may be used to extract a recovered clock signal and a recovered data signal from an input signal, in particular from a self-clocking input signal. That is, a clock is embedded in a transmitted data stream of the input signal. Therein, the extraction is for example realized by sampling the input signal using the recovered clock signal. In this way, CDR may avoid a potential clock skew for example between two physically separated data and clock channels.

For common CDR solutions an additional, for example external, precise reference clock source may be required. The reference clock source may for example be realized as an oscillator, in particular as a crystal oscillator. Several existing CDR solutions employ more than a single control loop, for example two control loops. These factors commonly represent drawbacks of existing solutions increasing for example cost, complexity, and/or size of a CDR arrangement. Other drawbacks of existing CDR circuit arrangements may include jitter, a lack of robust frequency acquisition and/or a lack of precise phase locking.

SUMMARY OF THE INVENTION

The present disclosure provides an improved concept for clock and data recovery that allows for overcoming drawbacks of existing solutions.

According to the improved concept, a single control loop, which is for example formed by a phase-locked loop circuit, is utilized for the generation of a recovered clock signal. In particular, a circuit arrangement according to the improved concept does not require a further control loop. Depending on a mode of operation, a control unit of the circuit arrangement selects a first or a second reference signal as an input for the control loop. Furthermore, according to the improved concept, no external clock source, in particular no external oscillator, for example a crystal oscillator, is required for the CDR.

A circuit arrangement for CDR according to the improved concept comprises a control unit, a phase-locked loop circuit and a sampling unit. The control unit is configured to derive a first reference signal and a second reference signal from an input signal. Furthermore, the control unit is configured to derive a common reference signal from one of the first reference signal and the second reference signal. Therein either the first reference signal or the second reference signal is selected as a basis for deriving the common reference signal depending on a mode of operation of the circuit arrangement. The phase-locked loop circuit is configured to generate an oscillator signal based on the common reference signal. The sampling unit is configured to extract a recovered data signal from the input signal.

Therein the extraction depends on the oscillator signal. In particular the sampling unit is configured to sample the input signal at instances corresponding to edges of the oscillator signal, for example corresponding to rising edges. The phase-locked loop circuit is configured to generate the oscillator signal such that the oscillator signal and the reference signal are synchronized with respect to each other.

According to several implementations of the circuit arrangement, the control unit is configured to derive the common reference signal from the first reference signal during a first locking mode of operation and to derive the common reference signal from the second reference signal during a second locking mode of operation and during a normal mode of operation.

The first locking mode, the second locking mode and the normal mode may, for example, follow each other in said sequence. The first locking mode may, for example, be initiated after powering up the circuit arrangement or before starting to receive a new data packet. A purpose of the first locking mode may, for example, be to achieve a locking, that is in particular a synchronization, of the common reference signal and the oscillator signal. A normal mode of operation may, for example, be intended to perform the extraction of the incoming data signal, that is the generation of the recovered data signal, utilizing the oscillator signal synchronized with the common reference signal.

The second locking mode, which may be situated between the first locking mode and the normal mode, may for example have the purpose of improving locking and/or synchronization of the common reference signal and the oscillator signal after the control unit switches from using the first reference signal to using the second reference signal for generating the common reference signal. In a sense, the second locking mode represents a buffer mode between the first locking mode and the normal mode.

In several implementations of the circuit arrangement, the phase-locked loop circuit is configured to utilize for the generation of the oscillator signal a first bandwidth during the first locking mode and a second bandwidth, being lower than the first bandwidth during the second locking mode and during the normal mode.

During the first locking mode, a higher bandwidth, namely the first bandwidth, is utilized for example to speed up the locking procedure, that is to reduce time necessary for achieving a synchronized common reference signal and oscillator signal. During the normal mode, however, it may be preferable to use a lower bandwidth, in particular the second bandwidth, for example for keeping the synchronization. In such implementations, the second locking mode may for example also serve as a buffer mode, for example to reduce variations due to the changing from the first to the second bandwidth.

In some implementations of the circuit arrangement, the control unit further comprises an edge detector and pulse generator circuit configured to generate a pulse signal and the first reference signal from the input signal.

In some implementations of the circuit arrangement, the pulse signal is an inverted version of the first reference signal and vice versa.

In some implementations of the circuit arrangement, the pulse signal consists of pulses with a width given by a predetermined fraction of a nominal bit period Tbn of the input signal, for example one half or approximately one half of the nominal bit period Tbn.

In some implementations of the circuit arrangement, the edge detector and pulse generator circuit is configured to generate positive and negative pulses at every edge of the input signal.

In some implementations of the circuit arrangement, the edge detector and pulse generator circuit is configured to generate the pulse signal by generating positive pulses at all edges of the input signal and the first reference signal by generating negative pulses at all edges of the input signal or vice versa.

In some implementations of the circuit arrangement, the control unit further comprises an edge detector and pulse generator circuit configured to generate a pulse signal and the first reference signal by means of an exclusive-or, XOR, operation. The XOR-operation, for example, combines the input signal and a version of the input signal being delayed with respect to the input signal by a predetermined fraction of a nominal bit period Tbn of the input signal.

A bit period of the input signal corresponds to a time period for which the input signal is kept to a logic high value in order to represent a bit value of logic high or to a logic low value in order to represent a bit value of logic low. Due to variations, for example due to process-voltage-temperature, PVT, variations, an actual bit period of the input signal may, however, deviate from a nominal value of the bit period, that is the nominal bit period Tbn.

The predetermined fraction of the nominal bit period Tbn may for example be one half of the nominal bit period Tbn. However, other fractions may be suitable for specific situations and/or applications.

In some implementations of the circuit arrangement, the phase-locked loop circuit comprises a first controlled delay line configured to generate the oscillator signal based on a control signal.

In some implementations of the circuit arrangement, the first controlled delay line is configured to generate the oscillator signal based on a control signal and on the oscillator signal itself.

In some implementation of the circuit arrangement, the first controlled delay line is configured to operate as a ring oscillator, in particular as a voltage controlled ring oscillator.

In some implementation of the circuit arrangement, the phase-locked loop circuit is configured to generate the control signal based on the common reference signal.

In some implementations of the circuit arrangement, the phase-locked loop circuit comprises a first controlled delay line configured to generate the oscillator signal based on a control signal, on the oscillator signal itself being fed back to the first controlled delay line, for example to an inverting input of the first controlled delay line, and on the oscillator signal being inverted and fed back to the first controlled delay line, for example to a non-inverting input of the first controlled delay line.

The phase-locked loop circuit, for example, compares a phase and/or a frequency of the oscillator signal to a phase and/or a frequency of the common reference signal in order to generate a control signal depending on the comparison. Due to the twofold feedback coupling of the first controlled delay line, the first controlled delay line effectively acts as a voltage control oscillator. In particular, the delay line may for example be configured to delay incoming signals by the fraction of the nominal bit period Tbn. However, the delay may be adjusted depending on the control signal during the course of operation.

In some implementations of the circuit arrangement, the control unit comprises a second controlled delay line being matched, in particular being implemented identically, to the first controlled delay line and configured to generate the second reference signal depending on the control signal and the input signal.

In some implementations of the circuit arrangement, the second controlled delay line is configured to generate the second reference signal by delaying the pulse signal by the predetermined fraction of the nominal bit period Tbn of the input signal, for example by one half or approximately one half of the nominal bit period Tbn.

In some implementations of the circuit arrangement, the phase-locked loop circuit comprises a phase-frequency detector. The phase-frequency detector is configured to compare the common reference signal to the oscillator signal, in particular to compare a phase and/or a frequency of the common reference signal to a phase and/or a frequency of the oscillator signal.

In some implementations of the circuit arrangement, the delay-locked loop circuit is configured to generate the control signal depending on the comparison.

In some implementations of the circuit arrangement, the phase-frequency detector is implemented as a three-state phase-frequency detector, for example as a linear three-state phase-frequency detector.

In some implementations of the circuit arrangement, the comparison of the phase and/or the frequency of the common reference signal to the phase and/or the frequency of the oscillator signal is a linear phase and/or frequency comparison.

In some implementations of the circuit arrangement, the phase-frequency detector is configured to be sensitive to rising edges of the common reference signal. In particular, the phase-frequency detector is configured to be sensitive to rising edges of the first reference signal during the first locking mode of operation and to rising edges of the second reference signal during the second locking mode of operation and during the normal mode of operation.

In some implementations of the circuit arrangement, the phase-frequency detector is configured to be sensitive to falling edges of the common reference signal. In particular, the phase-frequency detector is configured to be sensitive to falling edges of the first reference signal during the first locking mode of operation and to falling edges of the second reference signal during the second locking mode of operation and during the normal mode of operation.

In several implementations of the circuit, the phase-locked loop circuit comprises a gating element and a phase-frequency detector. The gating element is configured to pass or block the common reference signal and the oscillator signal depending on a gate signal. In particular, the gating element is configured to pass the common reference signal and the oscillator signal to the phase-frequency detector if the gate signal features a logic high value while the gating element is configured to block the common reference signal and the oscillator signal if the gate signal features a logic low value or vice versa. The phase-frequency detector is configured to compare the common reference signal to the oscillator signal, in particular to compare a phase and a frequency of the common reference signal to a phase and a frequency of the oscillator signal. Furthermore, the delay-locked loop circuit is configured to generate the control signal depending on the comparison.

According to further implementations of the circuit arrangement, the phase-locked loop circuit further comprises a charge pump and a loop filter. The charge pump is configured to generate a pump signal based on a first detector signal and on a second detector. The first and the second detector signals are generated by the phase-frequency detector depending on the comparison, in particular on a result of the phase comparison, of the common reference signal to the oscillator signal. The loop filter is configured to generate the control signal by filtering the pump signal.

In some implementations of the circuit arrangement the pump signal depends linearly or approximately linearly on a result of the comparison of the phase and/or the frequency of the common reference signal to the phase and/or the frequency of the oscillator signal by the phase-frequency detector.

According to other implementations of the circuit arrangement, the control unit further comprises a gate logic circuit configured to generate the gate signal based on the first reference signal, on a lock signal and on the mode of operation. The lock signal is generated by the phase-locked loop circuit and indicates whether the oscillator signal and the common reference signal are in a phase-locked state, that is they are synchronized. In order to determine whether the oscillator signal and the common reference signal are synchronized, the phase-locked loop circuit may, for example, determine whether a delay between an edge of the oscillator signal and an edge of the reference signal is smaller than a threshold value.

According to other implementations of the circuit arrangement, the phase-locked loop circuit further comprises a lock detector configured to determine the delay between an edge of the oscillator signal and the edge of the common reference signal and to generate the lock signal based on the determined delay.

In other implementations of the circuit arrangement, the gate logic circuit is further configured to generate the gate signal to cause the gating element to continuously pass the common reference signal and the oscillator signal during the first locking mode and during the second locking mode. Furthermore, the gate logic circuit is configured to determine during the normal mode whether the input signal features an edge suitable for being compared to an edge of the oscillator signal by means of the phase-frequency detector. The gate logic circuit is also configured to generate the gate signal to cause the gating element to pass or block the common reference signal and the oscillator signal depending on the determination.

In particular, the gate logic circuit may for example generate the gate signal causing the gating element to pass the common reference signal and the oscillator signal to the phase-frequency detector if an edge suitable for being compared to an edge of the oscillator signal is determined and to block the common reference signal and the oscillator signal otherwise during normal mode.

In further implementations of the circuit arrangement, the control unit comprises a second controlled delay line.

The second controlled delay line is for example matched, in particular is implemented identically, to the first controlled delay line and configured to generate the second reference signal by delaying the pulse signal depending on the control signal.

According to the improved concept also a method for CDR is provided. The method comprises deriving a first reference signal and a second reference signal from an input signal. A common reference signal is derived from one of the first reference signal and the second reference signal, wherein the first reference signal or the second reference signal is selected depending on a mode of operation. The method further comprises generating an oscillator signal based on the common reference signal and synchronizing the oscillator signal and the common reference signal. Furthermore, the method comprises extracting a recovered data signal from the input signal, wherein the extracting depends on the oscillator signal.

According to several implementations of the method, the common reference signal is derived from the first reference signal during a first locking mode of operation and from the second reference signal during a second locking mode of operation and during a normal mode of operation.

In several implementations of the method a first bandwidth is utilized for synchronizing the oscillator signal and the common reference signal during the first locking mode. Furthermore, during a second locking mode of operation and during a normal mode of operation, a second bandwidth is utilized for the synchronization.

According to other implementations of the method, a pulse signal and the first reference signal are generated by means of an XOR-operation. The XOR-operation combines the input signal and a version of the input signal being delayed with respect to the input signal by a predetermined fraction of a nominal bit period Tbn of the input signal. The second reference signal is generated by delaying the pulse signal depending on a control signal used for synchronizing the oscillator signal and the common reference signal.

Further implementations of the method are readily derived from the various implementations and embodiments of the circuit arrangement and vice versa.

BRIEF DESCRIPTION OF THE DRAWINGS

In the following the improved concept is explained in detail with the aid of exemplary implementations by reference to the drawings. Components that are functionally identical or have an identical effect may be denoted by identical references. Identical, respectively identical components, may be described with respect only to the figure where they first occur, their description is not necessarily repeated in successive figures.

In the drawings.

DETAILED DESCRIPTION

Figure 1:
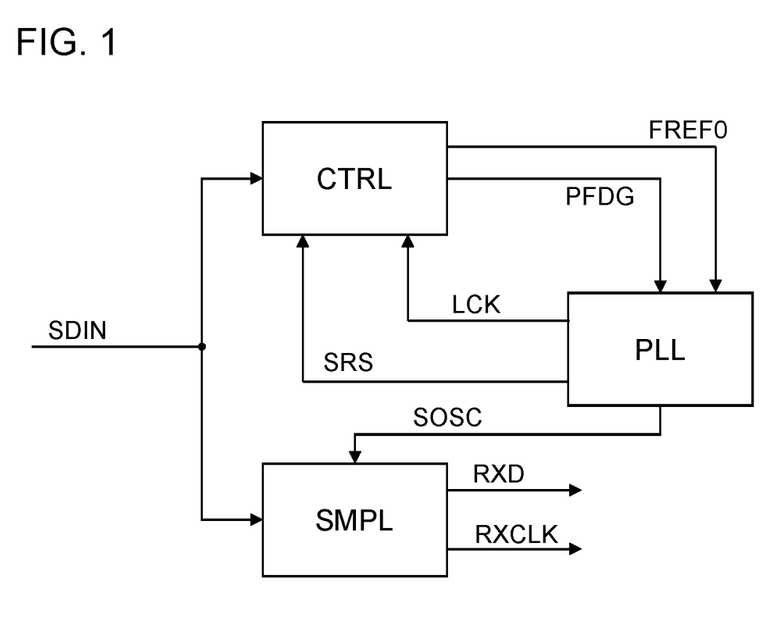
FIG. 1 shows an exemplary implementation of a circuit arrangement according to the improved concept.

FIG. 1 shows an exemplary implementation of a circuit arrangement for clock and data recovery, CDR, according to the improved concept. The circuit arrangement comprises a control unit CTRL, a phase-locked loop circuit PLL and a sampling unit SMPL. An input signal SDIN is supplied to the control unit CTRL and to the sampling unit SMPL. Preferably, the input signal SDIN is a self-clocking binary signal, in particular a self-clocking non-return-to-zero signal featuring a bit period Tb. Furthermore, the phase-locked loop circuit PLL is coupled between the control unit CTRL and the sampling unit SMPL and receives a gate signal PFDG as well as a common reference signal FREF0 from the control unit CTRL. The phase-locked loop circuit PLL provides a lock signal LCK and a reset signal SRS to the control unit CTRL and an oscillator signal SOSC to the sampling unit SMPL.

The control unit CTRL is configured to derive the common reference signal FREF0 from the input signal SDIN and depending on a mode of operation of the circuit arrangement. In particular, the control unit CTRL derives the common reference signal FREF0 from a first reference signal PLSN (not shown, see FIGS. 2 and 3) or from a second reference signal PLSD (not shown, see FIGS. 2 and 3), depending on the mode of operation. Based on the common reference signal FREF0, the phase-locked loop circuit PLL generates the oscillator signal SOSC utilizing first bandwidth or a second bandwidth, depending on the mode of operation.

The sampling unit SMPL extracts a recovered data signal RXD from the input signal SDIN and outputs a recovered clock signal RXCLK depending on the oscillator signal SOSC. In particular, the extraction is performed by sampling the input signal SDIN by means of the oscillator signal SO SC.

The modes of operation are, for example, a first locking mode, a second locking mode and a normal mode of operation. These operation modes may, for example, follow each other in said sequence. In particular, the first locking mode may for example be initiated after a power-on.

The purpose of the first locking mode is, for example, to achieve a phase-locked state of the phase-locked loop circuit PLL, that is in particular a synchronization of the common reference signal FREF0 and the oscillator signal SOSC. During the first locking mode a first bandwidth is used by the phase-locked loop circuit PLL to generate the oscillator signal SOSC and the common reference signal FREF0 is derived from the first reference signal PLSN. During the second locking mode and during the normal mode a second bandwidth is used by the phase-locked loop circuit PLL and the common reference signal FREF0 is derived from the second reference signal PLSD.

The first bandwidth and the second bandwidth, which is preferably lower than the first bandwidth, are for example achieved by means of internal settings, in particular charge pump current settings and/or filter settings, of the phase-locked loop circuit PLL. The end of the first locking mode may be indicated by a change of a logic state of the lock signal LCK. Such a change may be generated by the phase-locked loop circuit PLL for example in case a threshold condition for the synchronization of the common reference signal FREF0 and the oscillator signal SOSC is achieved. The threshold condition may, for example, correspond to a phase shift between the common reference signal FREF0 and the oscillator signal SOSC lying below a predetermined value during a predetermined number of consecutive periods of the common reference signal FREF0.

The change from the first reference signal PLSN to the second reference signal PLSD for deriving the common reference signal FREF0 and the change from using the first bandwidth to the second bandwidth may be advantageous for the normal mode of operation. The purpose of the second locking mode is, for example, to achieve a precise phase settling after said changes. The length of the second locking mode is, for example, controlled by the phase-locked loop circuit PLL, in particular by a counter comprised by the phase-locked loop circuit PLL. When a counter condition is fulfilled, the phase-locked loop circuit PLL may, for example, change the reset signal SRS indicating, for example, the end of the second locking mode to the control unit CTRL.

A purpose of the normal operating mode is, for example, to output the recovered clock signal RXCLK and to extract the recovered data signal RXD from the input signal SDIN based on the oscillator signal SOSC. During the normal mode, the control unit CTRL may for example control the gate signal PFDG, depending on the oscillator signal, on the input signal SDIN, in particular according to the first reference signal PLSN, and on the reset signal SRS. Therein, the gate signal PFDG may for example cause the phase-locked loop circuit PLL to pass or block the common reference signal FREF0. For example, the common reference signal FREF0 may be passed whenever the control unit CTRL determines that the input signal SDIN features an edge being suitable for a comparison with an edge of the oscillator signal SOSC to be performed by the phase-locked loop circuit PLL. After said comparison is completed, the phase-locked loop circuit PLL may indicate this to the control unit CTRL via the reset signal SRS.

The sampling unit may for example be configured to output the recovered data signal RXD and the recovered clock signal RXCLK only during the normal mode.

For example a preamble comprised by the input signal SDIN may indicate whether the sampling unit SMP shall output the recovered data signal RXD and the recovered clock signal RXCLK. The preamble may, for example, comprise a sequence of alternating logic high and logic low states with individual length corresponding to the bit period Tb. An end of the preamble and a beginning of a regular data stream of the input signal SDIN may be indicated to the sampling unit by a specific sequence of logic high and/or logic low states for example at an end of the preamble. The specific sequence may for example comprise a logic high state lasting for at least two bit periods 2*Tb and/or a logic low state lasting for at least two bit periods 2*Tb.

Figure 2:
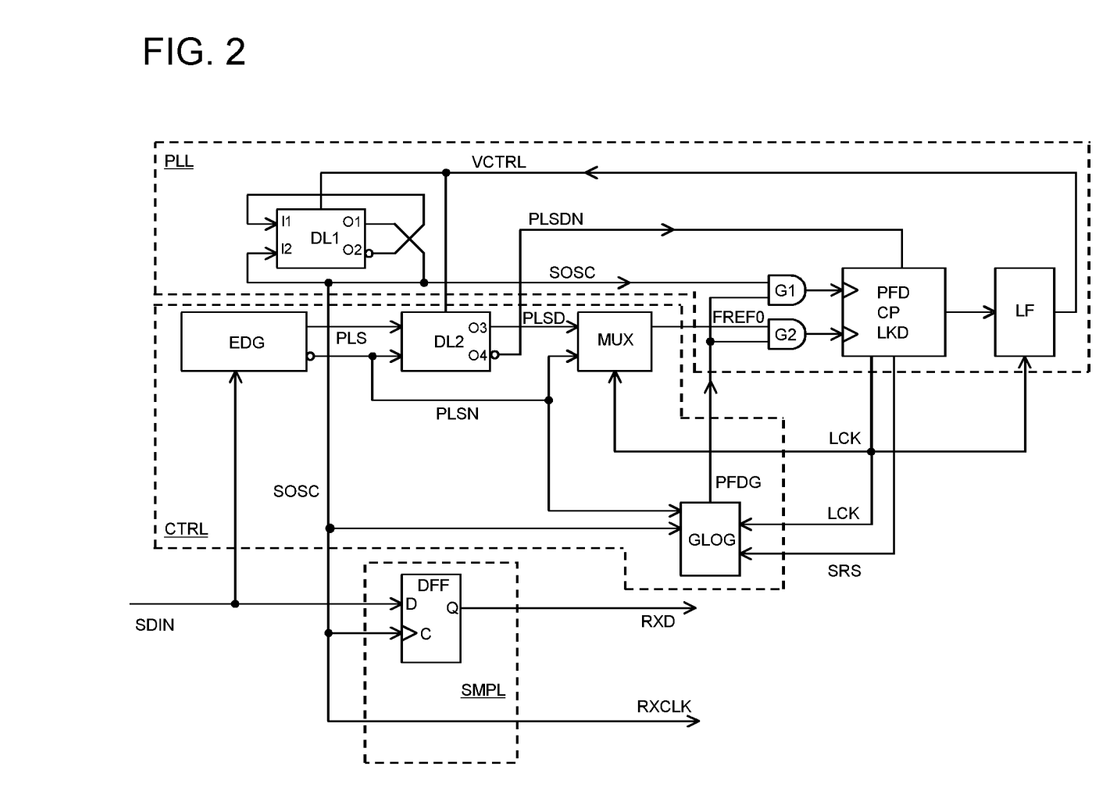
FIG. 2 shows a further exemplary implementation of a circuit arrangement according to the improved concept.

FIG. 2 shows a further exemplary implementation of the circuit arrangement according to the improved concept. The implementation of FIG. 2 is based on the one shown in FIG. 1, but the components of the circuit arrangement are specified in more detail in FIG. 2.

In the shown implementation the phase-locked loop circuit PLL comprises a first controlled delay line DL1 controlled by a control signal VCTRL. The phase-locked loop circuit PLL also comprises a circuit block containing a phase-frequency detector PFD, a charge pump CP and a lock detector LKD. The phase-frequency detector PFD is for example implemented as three-state phase-frequency detector, in particular as a linear three-state phase-frequency detector. Furthermore, the phase-locked loop circuit PLL comprises a loop filter LF and a gating element G1, G2 consisting of a first gate G1 and a second gate G2. The loop filter LF may for example be implemented as a second order filter, in particular as a second order RC-filter. The first and second gates G1, G2 are implemented as AND-gates in the shown example. In alternative implementations, the first and second gates G1, G2 may be implemented differently, for example as inverted AND-gates.

The control unit CTRL comprises an edge detector and pulse generator circuit EDG, a multiplexer MUX and a second controlled delay line DL2 coupled between the edge detector and pulse generator circuit EDG and the multiplexer MUX. The second controlled delay line DL2 may for example be matched with the first controlled delay line DL1, that is the second controlled delay line DL2 may be implemented identically to the first controlled delay line DL1 and be controlled by the same control signal VCTRL. Furthermore, the control unit CTRL comprises a gate logic circuit GLOG coupled to each of the other said components of the control unit CTRL and to the phase-locked loop circuit PLL.

The sampling unit SMPL comprises a sampling flip-flop DFF, in the shown example implemented as a D-flip-flop. The sampling flip-flop DFF receives the input signal SDIN at a sampling data input D and the oscillator signal SOSC from the phase-locked loop circuit PLL at a sampling clock input C. The sampling flip-flop DFF for example samples the input signal SDIN by means of rising edges of the oscillator signal SOSC and may output the recovered data signal RXD at a sampling output Q. In the shown implementation, the recovered clock signal RXCLK is for example given by the oscillator signal SOSC.

The gate logic circuit GLOG provides the gate signal PFDG to the first and the second gate G1, G2. During the first locking mode, the gate signal PFDG is for example constantly in a logic high state, that is the first and the second gate G1, G2 effectively pass the oscillator signal SOSC and the common reference signal FREF0, respectively, during the first locking mode. At a beginning of the first locking mode, that is for example after powering up the circuit arrangement, the oscillator signal SOSC and the common reference signal FREF0 are, for example, not synchronized which may be detected by the lock detector LKD. Consequently, the lock signal LCK generated by the lock detector LKD is, for example, set to a logic low value which may for example cause the multiplexer MUX to pass the first reference signal PLSN during the first locking mode.

Based on a comparison of the common reference signal FREF0 and the oscillator signal SOSC, the phase-frequency detector PFD, the charge pump CP and the loop filter LF may generate the control signal VCTRL and provide the control signal VCTRL to the first controlled delay line DL1. Consequently, internal delay settings of the first controlled delay line DL1 may be adjusted depending on the received control signal VCTRL.

The first controlled delay line DL1 comprises an inverting first input I1, a non-inverting second input I2, a non-inverted first output O1 and an inverted second output O2. The first output O1 is fed back to the first input I1, while the second output O2 is fed back to the second input I2 and also supplies the oscillator signal SOSC to the first gate G1, to the control unit CTRL, in particular to the gate logic circuit GLOG, and to the sampling flip-flop DFF. Due to such a connection of the first controlled delay line DL1, in particular due to said feedback connections, first controlled delay line DL1 may effectively operate as a voltage controlled oscillator, generating the oscillator signal SOSC.

The phase-locked loop circuit PLL may adjust the control signal VCTRL until eventually a delay due to the first controlled delay line DL1 corresponds or corresponds approximately to one half of the nominal bit period Tbn.

The edge detector and pulse generator circuit EDG generates a pulse signal PLS, for example by an XOR-combination of the input signal SDIN and a delayed version of the input signal SDIN. The first reference signal PLSN is the logic inverse of the pulse signal PLS. In particular, the pulse signal PLS may be delayed with respect to the input signal SDIN by one half of a nominal bit period Tbn of the input signal SDIN.

The second controlled delay line DL2 is implemented for example identical to the first controlled delay line DL1. The second controlled delay line DL2 provides the second reference signal PLSD at a non-inverted third output O3 to the multiplexer MUX and the delayed first reference signal PLSDN at an inverted fourth output O4 to the circuit block containing the phase-frequency detector PFD, the charge pump CP and the lock detector LKD. To this end the second controlled delay line DL2 delays the pulse signal PLS depending on the control signal VCTRL to generate the second reference signal PLSD. Furthermore, the second controlled delay line DL2 delays the first reference signal PLSN for example depending on the control signal VCTRL to generate a delayed first reference signal PLSDN.

During the first locking mode the phase-locked loop circuit PLL eventually achieves a phase-locked state, that is a synchronization of the oscillating signal SOSC and the common reference signal FREF0, by repeatedly generating the oscillating signal SOSC in the described way. The phase-locked state is determined, for example, by the lock detector LKD by comparing for example corresponding edges of the common reference signal FREF0 and the oscillator signal SOSC. If the said edges feature a delay with respect to each other lying below a threshold value, the lock detector may for example set the lock signal LCK to a logic high value. This may initiate the second locking mode.

Based on the logic high state of the lock signal LCK, internal settings of the charge pump CP and the loop filter LF may be changed to achieve a lower bandwidth, namely the second bandwidth of the phase-locked loop circuit PLL. Such a switching from a usage of the first bandwidth to a usage of the lower second bandwidth has, for example, the purpose of preparing for the normal mode, wherein the lower second bandwidth may be more suitable. Furthermore, the logic high state of the lock signal LCK may cause the multiplexer MUX to block the first reference signal PLSN and instead pass the second reference signal PLSD, which is effectively constituting the common reference signal FREF0 during the second locking mode. During the second locking mode, the phase-locked loop circuit PLL may achieve a more precise synchronization of the oscillator signal SOSC and the common reference signal FREF0.

The length of the second locking mode is for example controlled by a counter comprised by the phase-frequency detector PFD. If a counter condition is fulfilled, in particular if a certain operating time has passed during the second locking mode, the reset signal SRS may indicate when the counter condition is fulfilled to the control unit CTRL, in particular to the gate logic circuit GLOG. Then, the gate signal PFDG may be changed for example from a logic high state to a logic low state by the gate logic circuit GLOG. Consequently, the first and the second gate G1 and G2 do not pass the oscillator signal SOSC and the common reference signal FREF0 anymore until the gate signal PFDG features a logic high state again. The logic low state of the gate signal PFDG may indicate a beginning of the normal mode of operation.

During the normal mode, the gate signal PFDG may for example no longer be constantly logic high nor constantly logic low. Rather, it may be set to a logic high value in case the input signal SDIN, and consequently the first reference signal PLSN, features a rising edge or a falling edge that may be used for being compared to a respective edge of the oscillator signal SOSC by the phase-frequency detector PFD in order to adjust the oscillator signal SOSC. This may lead to a continuous checking and maintaining of the locked state, that is of the synchronization of the common reference signal FREF0 and the oscillator signal SOSC, during the normal mode. The said suitable edge is for example recognized by the gate logic circuit GLOG and consequently the gate signal PFDG is set to logic high causing the first and the second gate G1, G2 to pass the common reference signal FREF0 and the oscillator signal SOSC, respectively, and consequently to a comparison cycle of the phase-locked loop circuit PLL.

Depending on the comparison of the oscillator signal SOSC and the common reference signal FREF0 the phase-frequency detector, the charge pump CP and the loop filter LF generate the control signal VCTRL which leads to an adjustment of the oscillator signal SOSC. After the phase-frequency detector PFD has compared the common reference signal FREF0 to the oscillator signal SOSC, it may for example generate a logic low pulse of the reset signal SRS. As a response, the gate logic circuit GLOG may set the gate signal PFDG to logic low until another suitable edge is detected by the gate logic circuit GLOG as described above.

In some implementations, the phase-frequency detector PFD is for example sensitive to rising edges of the oscillator signal SOSC and/or the common reference signal FREF0. In particular in such implementations, the first and/or the second gate G1, G2 may be implemented as AND-gates.

In some implementations, the phase-frequency detector PFD is for example sensitive to falling edges of the oscillator signal SOSC and/or the common reference signal FREF0. In particular in such implementations, the first and/or the second gate G1, G2 may be implemented as inverted AND-gates, that is NAND-gates.

Figure 3:
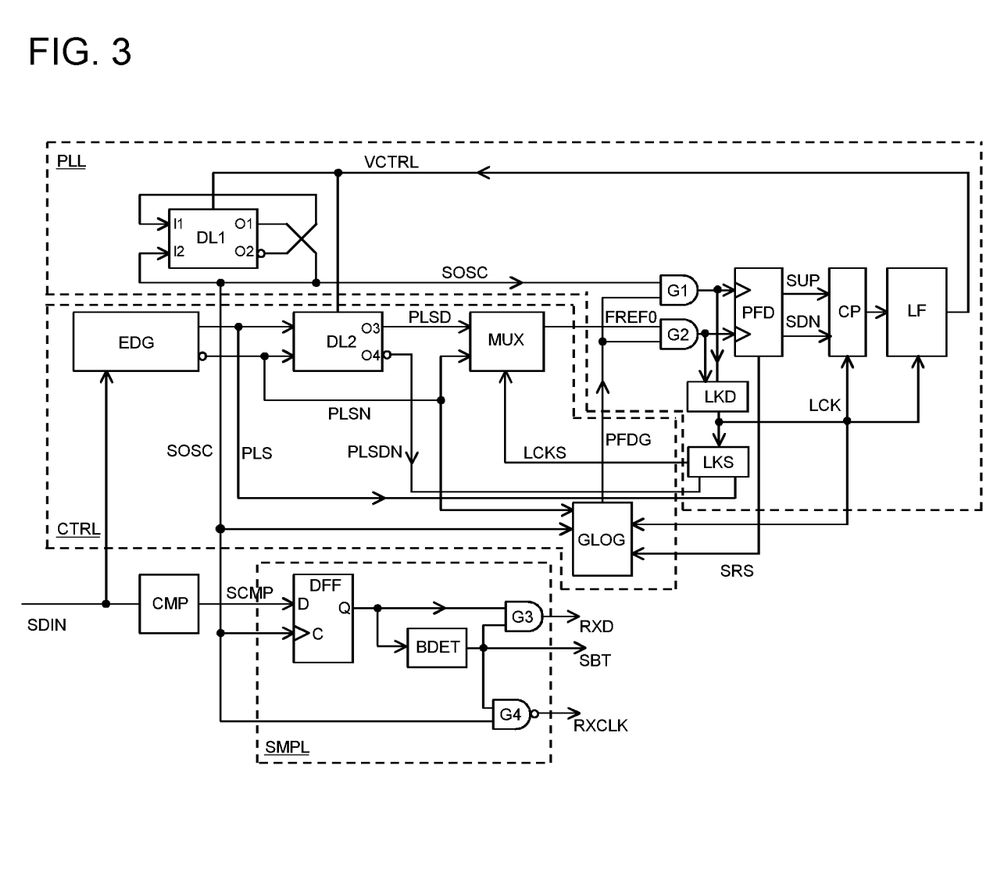
FIG. 3 shows a further exemplary implementation of a circuit arrangement according to the improved concept.

FIG. 3 shows a further exemplary implementation of the circuit arrangement according to the improved concept. The implementation of FIG. 3 is based on the one shown in FIG. 2. In the implementation of FIG. 3, the sampling unit SMPL further comprises a start bit detector BDET coupled to the sampling output Q, a gate delay compensation circuit CMP coupled to the sampling data input D, a third gate G3 and a fourth gate G4. The third gate G3 has a first and a second input coupled to the sampling output Q and to an output of the start bit detector, respectively. In the shown example, the third gate G3 is implemented as an AND-gate and outputs the recovered data signal RXD. The fourth gate G4 has a first and a second input coupled to the output of the start bit detector and to the non-inverted first output O1 of the first controlled delay line DL1, respectively. In the shown example, the third gate G3 is implemented as an inverted AND-gate and outputs the recovered clock signal RXCLK.

In FIG. 3, the phase-frequency detector PFD, the charge pump CP and the lock detector LKD are depicted separately. The phase-frequency detector PFD generates a first detector signal SUP and a second detector signal SDN based on a comparison of the common reference signal FREF0 and the oscillator signal SOSC and provides said detector signals SUP, SDN to the charge pump CP. A combination of states of the first and second detector signals SUP, SDN may for example cause the charge pump CP to generate, together with the loop filter LF, the control signal VCTRL accordingly to adjust an operation, in particular a delay setting, of the first controlled delay line DL1.

Furthermore, the phase-locked loop circuit PLL comprises a lock synchronizer LKS coupled to the lock detector LKD, to the multiplexer MUX and to the edge detector and pulse generator circuit EDG. The lock detector LKD may compare the common reference signal FREF0 and the oscillator signal SOSC to determine whether the locked state is achieved and consequently generate the lock signal LCK as described above. In the shown example, the multiplexer MUX, however, may for example not receive the lock signal LCK from the lock detector LKD, but rather may receive a synchronized lock signal LCKS from the lock synchronizer LKS.

Therein the lock synchronizer LKS generates the synchronized lock signal LCKS based on the lock signal LCK. To this end, the lock synchronizer LKS may for example delay the lock signal LCK depending on the pulse signal PLS and the delayed first reference signal PLSDN. In particular, after the lock signal LCK has changed from a logic low to a logic high value, the lock synchronizer LKS changes for example the synchronized lock signal LCKS from a logic low to a logic high value only when the first reference signal PLSN and the second reference signal PLSD both feature a logic low value. In this way for example false rising or falling edges or glitches at the phase-frequency detector PFD may be avoided.

The gate delay compensation circuit CMP for example adds a delay to the input signal SDIN in order to compensate for internal delays of the control unit CTRL and/or the phase-locked loop circuit PLL, in particular delays of the edge detector and pulse generator circuit EDG and of the multiplexer MUX.

The start bit detector BDET determines whether the input signal SDIN features the preamble and in particular may recognize the specific sequence of logic high and/or logic low states indicating the end of the preamble and the beginning of the regular data stream of the input signal SDIN. In case the start bit detector BDET has recognized the specific sequence, it may for example output a logic high signal to the third and the fourth gate G3, G4. Consequently, the third gate may pass the recovered data signal RXD and the fourth gate G4 may pass and invert the oscillator signal SOSC to generate the recovered clock signal RXCLK. The generation of the recovered clock signal RXCLK including the inversion of the oscillator signal SOSC represents an alternative to the recovered clock signal RXCLK being given by the non-inverted oscillator signal SOSC as shown in FIG. 2.

Figure 4:
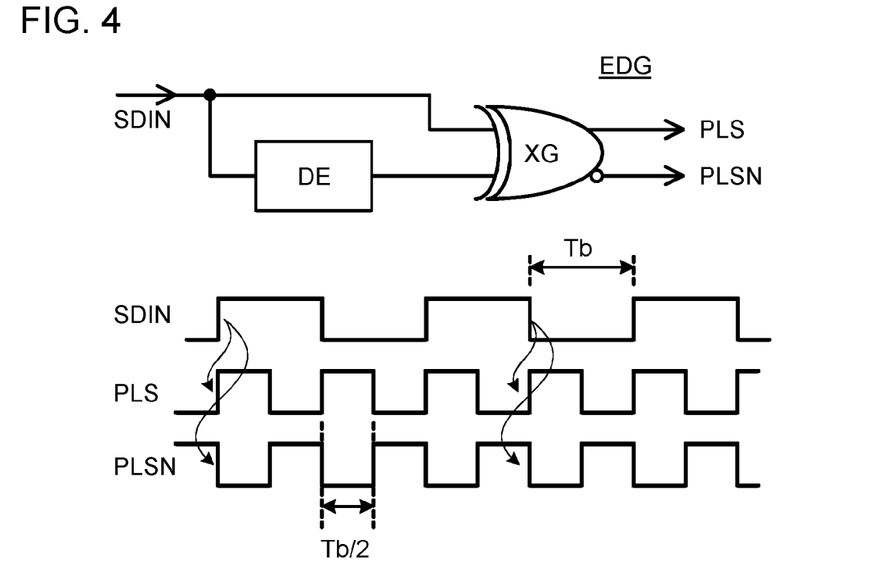
FIG. 4 shows an exemplary implementation of an edge detector and pulse generator circuit and a corresponding timing diagram.

The upper part of FIG. 4 shows an exemplary implementation of an edge detector and pulse generator circuit EDG. The edge detector and pulse generator circuit EDG comprises a delay element DE and an XOR-gate XG. An input of the delay element DE is supplied with the input signal SDIN and an output of the delay element DE is coupled to a first input of the XOR-gate XG. The delay element for example delays the input signal by one half of the nominal bit period Tbn. A second input of the XOR-gate XG is supplied by the input signal SDIN. A non-inverted output of the XOR-gate XG supplies the pulse signal PLS, while an inverted output of the XOR-gate supplies the first reference signal PLSN.

In the lower part of FIG. 4 a corresponding timing diagram of the input signal SDIN, the pulse signal PLS and the first reference signal PLSN is shown. Therein, a sequence of the input signal SDIN is shown, consisting of a series of subsequent high states and low states having a length of the bit period Tb, respectively. The pulse signal PLS and the first reference signal PLSN generated in this way feature rising edges that are synchronized with rising edges of the input signal SDIN. Furthermore, the pulse signal PLS and the first reference signal PLSN feature series of alternating logic high states and logic low states, in the shown example with periods of one half of the bit period Tb.

Figure 5:
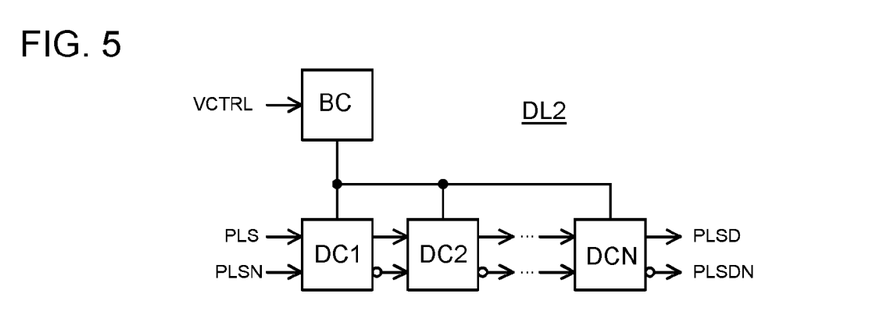
FIG. 5 shows an exemplary implementation of a controlled delay line.

FIG. 5 shows an exemplary implementation of the second controlled delay line DL2, comprising a bias circuit BC and a plurality of delay cells DC1, DC2, DCN. The bias circuit BC receives the control signal VCTRL and provides respective steering signals to the plurality of delay cells DC1, DC2, DCN based on the control signal VCTRL. The first delay cell DC1 receives the pulse signal PLS and the first reference signal PLSN and outputs delayed versions of said signals to the second delay cell DC2. In an analog manner each delay cell of the plurality of delay cells DC1, DC2, DCN delays the respective incoming signals and eventually the second reference signal PLSD and the delayed first reference signal PLSDN are generated by the last delay cell DCN.

Depending on the actual implementation of the second controlled delay line DL2, an overall delay caused by the second controlled delay line DL2 may be increased or decreased if the control signal VCTRL increases. Correspondingly, the overall delay may be decreased or increased if the control signal VCTRL decreases.

The first controlled delay line DL1 is for example implemented in an identical way to the second controlled delay line DL2. For the first controlled delay line DL1 implemented in a circuit arrangement according to the improved concept, the respective input and output signals of the plurality of delay cells DC1, DC2, DCN are to be adapted accordingly.

Figure 6:
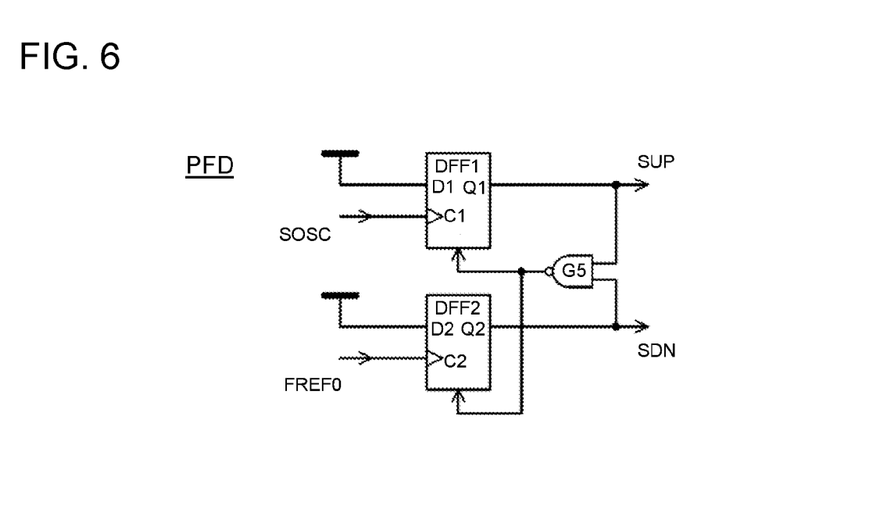
FIG. 6 shows an exemplary implementation of a phase-frequency detector.

FIG. 6 shows an exemplary implementation of a phase-frequency detector PFD implemented as a linear three-state phase-frequency detector. The phase-frequency detector PFD comprises a first detector flip-flop DFF1 and a second detector flip-flip DFF2 as well as a fifth gate G5. A first data input D1 of the first detector flip-flop DFF1 and a second data input D2 of the second detector flip-flop DFF2 are, for example, connected to constant logic high states. A first clock input C1 of the first detector flip-flop DFF1 receives the oscillator signal SOSC and a second clock input C2 of the second detector flip-flop DFF2 receives the common reference signal FREF0. At a first output Q1 of the first detector flip-flop DFF1 the first detector signal SUP is generated and at a second output Q2 of the second detector flip-flop DFF2 the second detector output SDN is generated.

The first and the second detector output signals SUP and SDN are supplied to a first input and a second input of the fifth gate G5, respectively. In the shown example the fifth gate G5 is implemented as an inverted AND-gate. An output of the fifth gate G5 is connected to a reset input of the first detector flip-flop DFF1 and to a reset input of the second detector flip-flop DFF2.

In this way, the phase-frequency detector PFD may for example generate a pulse in the first detector signal SUP when the common reference signal FREF0 is delayed with respect to the oscillator signal SOSC and generate a pulse in the second detector signal SDN when the oscillator signal SOSC is delayed with respect to the common reference signal FREF0.

The implementation shown in FIG. 6 corresponds to an implementation of the circuit arrangement, wherein an overall delay caused by the first controlled delay line DL1 and an overall delay caused by the second delay line DL2 are decreased when the control signal VCTRL increases. In an alternative implementation, wherein the overall delay caused by the first controlled delay line DL1 and the overall delay caused by the second delay line DL2 are increased when the control signal VCTRL increases, the first and the second clock inputs C1, C2 would be supplied in an opposite way. That is, in such an implementation, the first clock input C1 of the first detector flip-flop DFF1 receives the common reference signal FREF0 and the second clock input C2 of the second detector flip-flop DFF2 receives the oscillator signal SOSC.

Figure 7:
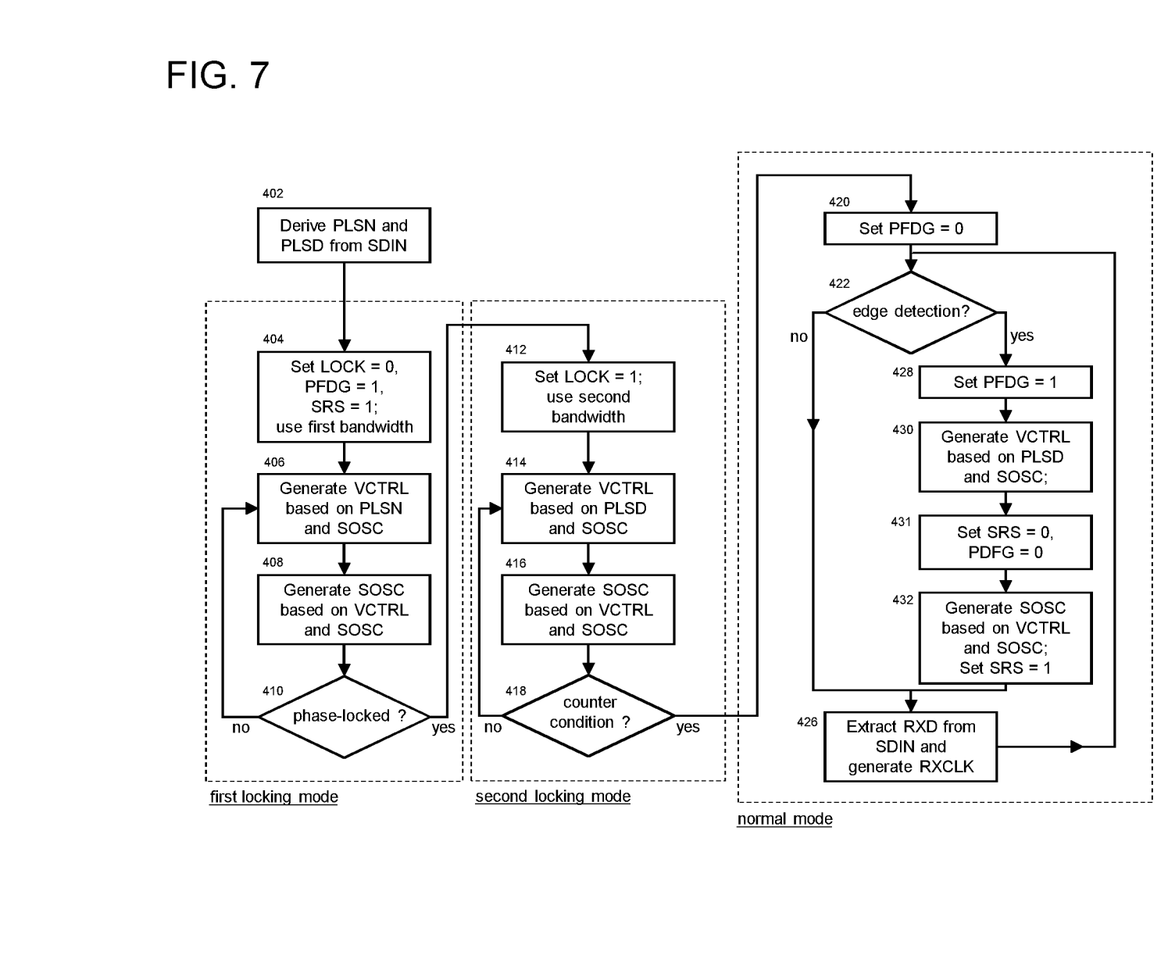
FIG. 7 shows a flow chart representing an exemplary implementation of a method for CDR according to the improved concept.

FIG. 7 shows a flow chart representing a method for CDR according to the improved concept.

In block 402 the first reference signal PLSN and the second reference signal PLSD are derived from the input signal SDIN. The following blocks 404 to 410 correspond to the first locking mode. In block 404 the lock signal LOCK is set to logic low or remains at logic low while the gate signal PFDG and the reset signal SRS are both set to or remain at logic high. Furthermore, the first bandwidth is used, that is internal settings, for example current settings and/or filter settings of the phase-locked loop circuit PLL, are adjusted to achieve the first bandwidth.

Then, in block 406, the control signal VCTRL is generated based on a comparison of the common reference signal FREF0 and the first reference signal PLSN. In particular, a phase and/or a frequency of the common reference signal FREF0 is compared to a phase and/or a frequency of the first reference signal PLSN. Based on the control signal VCTRL and the oscillator signal SOSC the oscillator signal SOSC is generated, in particular is adapted.

It is then determined in block 410 whether a phase-locked state of the oscillator signal SOSC and the common reference signal FREF0 is achieved, that is whether the oscillator signal SOSC and the common reference signal FREF0 are synchronized. If this is not the case the method starts over with block 406. If a phase-locked state is achieved, the method proceeds to the second locking mode comprising blocks 412 to 418.

In block 412 the lock signal LCK is set to logic high and a second bandwidth is used from now on for the generation of the control signal VCTRL and the adjustment of the oscillator signal SOSC. In block 414 the control signal VCTRL is generated based on the second reference signal PLSD and the oscillator signal SOSC. Again the oscillator signal SOSC is adapted based on the control signal VCTRL and the oscillator signal SOSC itself in block 416. In block 418 it is determined whether a counter condition is fulfilled, in particular it is determined whether a certain time associated with a predetermined period of the second locking mode has elapsed. If this is not the case the method starts over with block 414. If the counter condition is fulfilled the normal mode of operation, comprising blocks 420 to 426, is initiated.

In block 420 the gate signal PFDG is set to logic low. It is then determined in block 422 whether the input signal SDIN or the first reference signal PLSN, respectively, comprises an edge that is suitable to be compared with the oscillator signal SOSC. If this is not the case, the recovered data signal RXD is extracted from the input signal SDIN utilizing the oscillator signal SOSC in block 426. The recovered clock signal RXCLK is generated based on the oscillator signal SOSC.

Then it is again determined in block 422 whether an edge is comprised by the input signal SDIN that it is suitable for being compared with the oscillator signal SOSC. If in block 422 such an edge is determined, the method is continued with block 428 instead of block 426. In block 428 the gate signal PFDG is set to logic high. In block 430 the control signal VCTRL is generated based on the second reference signal PLSD and on the oscillator signal SOSC. Then, in block 431, the reset signal SRS and the gate signal are both set to logic low. In block 432 the oscillator signal SOSC is generated based on the control signal VCTRL and the oscillator signal SOSC itself and the reset signal SRS is set to logic high. Then the method proceeds with block 426 as before. During the normal mode, blocks 422 to 432 and 426 are carried out repeatedly as described.

Figure 8:
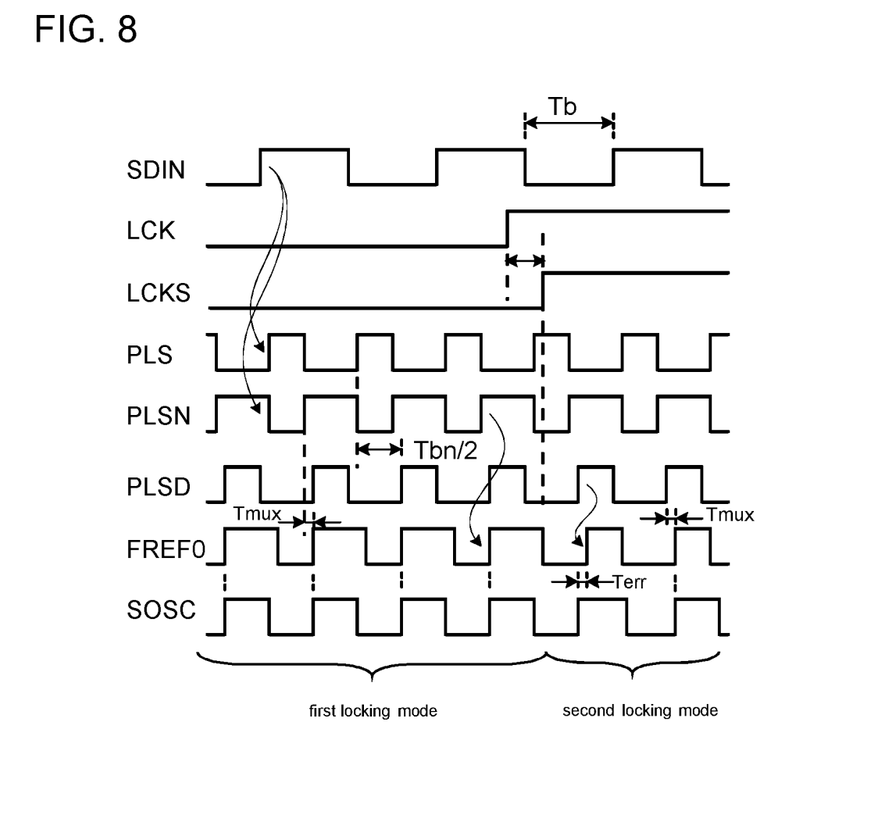
FIG. 8 shows a timing diagram of a circuit arrangement according to the improved concept during first and second locking modes.

FIG. 8 shows a timing diagram of a circuit arrangement according to the improved concept operating in the first locking mode and in the second locking mode.

The diagram shows the input signal SDIN, which features for example the preamble consisting of a sequence of alternating logic high and logic low states with periods given by the bit period Tb. Based on the input signal SDIN the pulse signal PLS and the first reference signal PLSN are generated by the edge detector and pulse generator circuit EDG, see also FIG. 4.

In an ideal case, periods of logic high states and logic low states for example of the pulse signal PLS are of the same length, namely half of the nominal bit period Tbn, and rising edges of the pulse signal PLS are synchronized with rising edges of the input signal SDIN, as shown in FIG. 4. However, for example due to inevitable variations, in particular power-voltage-temperature, PVT, variations, deviations from said ideal case occur as depicted in FIG. 8. The second reference signal PLSD is generated by the second controlled delay line DL2 by delaying the pulse signal PLS by a period of Tbn/2.

During the first locking mode, that is when the synchronized lock signal LCKS is logic low, the common reference signal FREF0 is given by the first reference signal PLSN, wherein a multiplexer delay Tmux due the operation of the multiplexer MUX may be present. After the lock signal LCK has been switched from logic low to logic high by the lock detector LKD, the lock synchronizer LKS generates the synchronized lock signal LCKS. Therein, the synchronized lock signal LCKS is for example generated by delaying the lock signal LCK such that a rising edge of the synchronized lock signal LCKS coincides with a logic low state of the first and the second reference signal PLSN, PLSD.

During the second locking mode, that is when the synchronized lock signal LCKS is logic high, the common reference signal FREF0 is given by the second reference signal PLSD. Also here, the common reference signal FREF0 may be delayed with respect to the second reference signal PLSD by the multiplexer delay Tmux. Directly after the change from the first to the second locking mode, there may be a delay Terr between edges of the oscillator signal SOSC and edges of the common reference signal FREF0, as indicated in FIG. 8. The delay Terr may originate from a deviation of a pulse width of the pulse signal PLS from the nominal value of Tbn/2.

After some time of operation in the second locking mode, the delay Terr may be cured for example by adjusting the oscillator signal SOCS, as shown. Then, when the operating mode is changed from the second locking mode to the normal mode (not shown), a similar delay may be negligible, since there is no further change in the common reference signal FREF0 nor in the bandwidth of the phase-locked loop circuit PLL.

Figure 9:
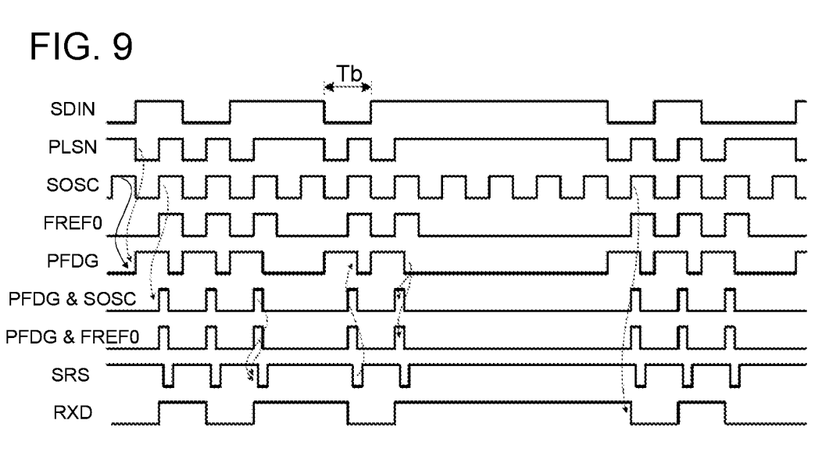
FIG. 9 shows a timing diagram of a circuit arrangement according to the improved concept during normal mode.

FIG. 9 shows a timing diagram of a circuit arrangement according to the improved concept operating in the normal mode. Shown is an exemplary sequence of the input signal SDIN and the correspondingly derived first reference signal PLSN. Furthermore, the oscillator signal SOSC and the common reference signal FREF0 are shown, being in a phase-locked state, that is their rising edges being synchronized.

Whenever the first reference signal PLSN shows a falling edge, in such case the input signal SDIN shows a rising edge or a falling edge, that is suitable for being compared with a rising edge of the oscillator signal SOSC, the gate signal PFDG may be switched from logic low to logic high. This for example causes the first and the second gate G1, G2 to pass the oscillator signal SOSC and the common reference signal FREF0, respectively. This is indicated in FIG. 9 for example by timing sequences of an AND-combination of the gate signal PFDG with the oscillator signal SCOSC and of an AND-combination of the gate signal PFDG with the common reference signal FREF0.

When the phase-frequency detector PFD has finished the comparison of the oscillator signal SOSC and the common reference signal FREF0, the phase-frequency detector PFD generates a logic low pulse in the reset signal SRS and consequently the gate signal PFDG is reset to logic low by the gate logic circuit until another suitable edge for comparison is available. A resulting timing sequence of the recovered data signal RXD is shown lowermost.

Figure 10:
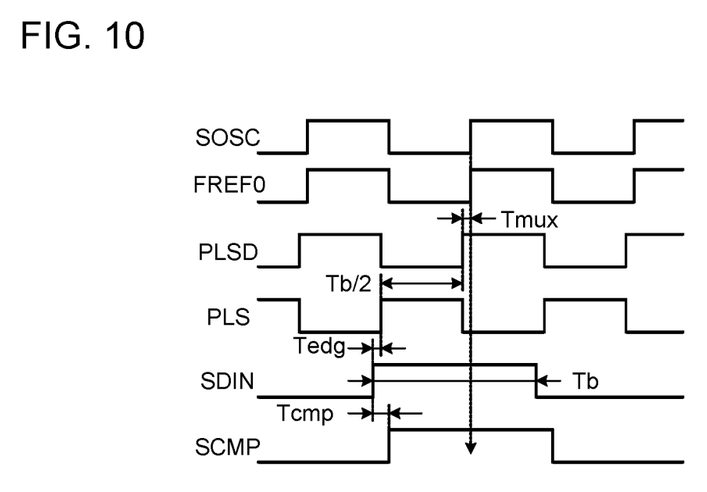
FIG. 10 shows another timing diagram of a circuit arrangement according to the improved concept during normal mode.

FIG. 10 shows a further timing diagram of a circuit arrangement according to the improved concept operating for example in the normal mode. The circuit arrangement comprises a gate delay compensation circuit CMP as for example an implementation according to FIG. 3.

For example, due to PVT variations, internal variations of the components or other variations and effects, delays in various signals may occur. A multiplexer delay Tmux that is, for example, caused by variations related to the multiplexer MUX may exist between a rising edge of the second reference signal PLSD and the common reference signal FREF0. Furthermore, a generator delay Tedg, for example, caused by variations related to the edge detector and pulse generator circuit EDG may exist between a rising edge of the pulse signal PLS and a rising edge of the input signal SDIN. In the shown example, said multiplexer delay Tmux and generator delay Tedg may add up to a total delay Tcmp =Tmux +Tedg.

In an ideal case, the multiplexer delay Tmux and the generator delay Tedg, and consequently the total delay Tcmp, would be zero and a rising edge of the oscillator signal SOSC would for example be exactly at a center between a rising edge and a falling edge of the input signal SDIN. In a real system, due to said variations, the total delay Tcmp may, however, deviate from zero. In low-speed applications, the deviation may be negligible. However, for example in high-speed applications, the deviations and the fact that said rising edge of the oscillator signal SOSC may be shifted with respect to the center may be non-negligible and consequently may have to be compensated.

This compensation may for example be achieved by adding a delay equal to the total delay Tcmp to the input signal SDIN by means of the gate delay compensation circuit CMP before the input signal SDIN is sampled using the sampling flip-flop DFF. To this end, components similar to the multiplexer MUX and the edge detector and pulse generator circuit EDG may be implemented within the compensation unit CMP. These similar components show for example the same or approximately the same PVT variations as the actual multiplexer MUX and the actual edge detector and pulse generator circuit EDG do.

In a similar manner, also other delays in addition or alternatively to the multiplexer delay Tmux and the generator delay Tedg may be cured by means of the gate delay compensation circuit CMP. In this way, it may be achieved that the sampling by means of the oscillator signal SDIN is carried out at the center between the rising edge and the falling edge of the input signal SDIN.

It is highlighted that a sampling instance needs not necessarily be located at a center between a rising edge and a falling edge of the input signal SDIN, as has been described above for illustrator reasons. Rather, the sampling is preferably carried out in the middle of a bit period of the input signal SDIN, which is in the example of FIG. 10, but not in general, identical to the center between the rising edge and the falling edge of the input signal SDIN.

By means of an implementation for CDR according to the improved concept, drawbacks of existing solutions may be overcome. In particular, the improved concept provides a circuit arrangement and method for CDR that does not require more than a single control loop nor an external reference frequency.

For example, the usage of a phase-frequency detector may contribute to a low level of jitter, a robust frequency acquisition and/or a precise locking.

Furthermore, the changing from the first reference signal PLSN to the second reference signal PLSD for deriving the common reference signal FREF0 may for example allow an improved accuracy of the circuit arrangement. For example, the pulse signal PLS and first reference signal PLSN may feature minimum pulse widths deviating from an intended value of one half of the nominal bit period Tbn due to PVT variations. For a high accuracy, the sampling of the input signal SDIN by the sampling unit SMPL preferably happens in the center of a bit periods. This sampling may become particularly accurate with respect to the center of the bit period by using the second reference signal PLSD in the normal mode instead of the first reference signal (see for example also FIG. 10).

REFERENCE NUMERALS

CTRL control unit
PLL phase-locked loop
SMPL sampling unit
DL1, DL2 controlled delay lines
PFD phase-frequency detector
CP charge pump
LF loop filter
EDG edge detector and pulse generator circuit
LKD lock detector
LKS lock synchronizer
GLOG gate logic circuit
DFF sampling flip-flop
MUX multiplexer
G1, G2, G3, G4, G5 gates
BDET start bit detector
D data input
C clock input
Q sampling output
CMP gate delay compensation circuit
FREF0 common reference signal
PLSN first reference signal
PLSD second reference signal
SOSC oscillator signal
RXCLK recovered clock signal
RXD recovered data signal
SDIN input signal
VCTRL control signal
PFDG gate signal
SUP, SDN detector signals
PLS pulse signal
LCK lock signal
SRS reset signal
PLSDN delayed first reference signal
SBT start bit signal
LCKS synchronized lock signal

The invention claimed is:

1. A circuit arrangement for clock and data recovery comprising:
   a control unit configured to derive
      a first reference signal and a second reference signal from an input signal, and
      a common reference signal from one of the first reference signal and the second reference signal selected depending on a mode of operation of the circuit arrangement;
   a phase-locked loop circuit configured to generate an oscillator signal based on the common reference signal and to synchronize the oscillator signal and the common reference signal with respect to each other; and
   a sampling unit configured to extract, depending on the oscillator signal, a recovered data signal from the input signal.

2. The circuit arrangement according to claim 1, wherein the control unit is configured:
   to derive the common reference signal from the first reference signal during a first locking mode of operation; and
   to derive the common reference signal from the second reference signal during a second locking mode of operation and during a normal mode of operation.

3. The circuit arrangement according to claim 2, wherein the phase-locked loop circuit is configured:
   to utilize a first bandwidth during the first locking mode; and
   to utilize a second bandwidth being lower than the first bandwidth during the second locking mode and during the normal mode.

4. The circuit arrangement according to claim 1, wherein the control unit further comprises an edge detector and pulse generator circuit configured to generate a pulse signal and the first reference signal using an XOR-operation combining the input signal and a version of the input signal being delayed by with respect to the input signal by a predetermined fraction of a nominal bit period Tbn of the input signal.

5. The circuit arrangement according to claim 1, wherein the phase-locked loop circuit comprises a first controlled delay line configured to generate the oscillator signal based on a control signal, on the oscillator signal being fed back to the first controlled delay line and on an inverted oscillator signal being fed back to the first controlled delay line.

6. The circuit arrangement according to claim 5, the phase-locked loop circuit comprising:
   a gating element configured to pass or block the common reference signal and the oscillator signal depending on a gate signal; and
   a phase-frequency detector configured to compare the common reference signal to the oscillator signal, and configured to generate the control signal depending on the comparison.

7. The circuit arrangement according to claim 6, wherein the phase-locked loop circuit further comprises:
   a charge pump configured to generate a pump signal based on a first detector signal and a second detector signal generated by the phase-frequency detector; and
   a loop filter configured to generate the control signal by filtering the pump signal.

8. The circuit arrangement according to claim 6, wherein the control unit further comprises a gate logic circuit configured to generate the gate signal based on the first reference signal, on the oscillator signal, on a lock signal and on the mode of operation, and
   wherein the lock signal is generated by the phase-locked loop circuit and indicates whether the oscillator signal and the common reference signal are in a phase-locked state.

9. The circuit arrangement according to claim 8, wherein the phase-locked loop circuit further comprises a lock detector configured:
- to determine a delay between an edge of the oscillator signal and an edge of the common reference signal; and
- to generate the lock signal based on the delay.

10. The circuit arrangement according to claim 8, wherein the gate logic circuit is further configured:
- to generate the gate signal to cause the gating element to continuously pass the common reference signal and the oscillator signal during the first locking mode and the second locking mode;
- to determine during the normal mode whether the input signal features an edge suitable for being compared to an edge of the oscillator signal by the phase-frequency detector; and
- to generate the gate signal to cause the gating element to pass or block the common reference signal and the oscillator signal depending on the determination.

11. The circuit arrangement according to claim 5, wherein the control unit comprises a second controlled delay line being matched to the first controlled delay line and configured to generate the second reference signal by delaying the pulse signal depending on the control signal.

12. A method for clock and data recovery, wherein the method comprises:
- deriving a first reference signal and a second reference signal from an input signal;
- deriving a common reference signal from one of the first reference signal and the second reference signal selected depending on a mode of operation;
- generating an oscillator signal based on the common reference signal;
- synchronizing the oscillator signal and the common reference signal; and
- extracting, depending on the oscillator signal, a recovered data signal from the input signal.

13. The method according to claim 12, wherein the common reference signal is derived from the first reference signal during a first locking mode of operation, and
wherein the common reference signal is derived from the second reference signal during a second locking mode of operation and during a normal mode of operation.

14. The method according to claim 13, wherein for synchronizing the oscillator signal and the common reference signal:
- a first bandwidth is utilized during the first locking mode; and
- a second bandwidth being lower than the first bandwidth is utilized during the second locking mode and during the normal mode.

15. The method according to claim 12, wherein a pulse signal and the first reference signal are generated using an XOR-operation combining the input signal and a version of the input signal being delayed with respect to the input signal by a predetermined fraction of a nominal bit period Tbn of the input signal, and
wherein the second reference signal is generated by delaying the pulse signal depending on a control signal used for synchronizing the oscillator signal and the common reference signal.

16. The method according to claim 12, wherein the oscillator signal is generated with a first controlled delay line based on a control signal, on the oscillator signal being fed back to the first controlled delay line and on an inverted oscillator signal being fed back to the first controlled delay line.

17. The method according to claim 16, wherein the common reference signal and the oscillator signal are passed or blocked depending on a gate signal, and the control signal is generated depending on a phase-frequency comparison of the common reference signal and the oscillator signal.

18. The method according to claim 17, wherein the gate signal is generated based on the first reference signal, on the oscillator signal, on a lock signal and on the mode of operation, and wherein the lock signal indicates whether the oscillator signal and the common reference signal are in a phase-locked state.

19. The method according to claim 18, wherein a delay between an edge of the oscillator signal and an edge of the common reference signal is determined, and wherein the lock signal is generated based on the delay.

20. The method according to claim 16, wherein the second reference signal is generated by, depending on the control signal, delaying the pulse signal with a second controlled delay line being matched to the first controlled delay line.

* * * * *